United States Patent [19]

Van Ness

[11] Patent Number: 4,870,619
[45] Date of Patent: Sep. 26, 1989

[54] MEMORY CHIP ARRAY WITH INVERTING AND NON-INVERTING ADDRESS DRIVERS

[75] Inventor: Brian J. Van Ness, Aurora, Colo.

[73] Assignee: Monolithic Systems Corp., Englewood, Colo.

[21] Appl. No.: 918,510

[22] Filed: Oct. 14, 1986

[51] Int. Cl.$^4$ .............................................. G11C 7/02
[52] U.S. Cl. ..................................... 365/208; 365/63; 365/214
[58] Field of Search ............... 365/230, 206, 208, 214, 365/63

[56] References Cited

U.S. PATENT DOCUMENTS 3,161,860 12/1964 Grooteboer ........................ 365/214
4,596,001  6/1986 Baba .................................... 365/230

Primary Examiner—James W. Moffitt
Attorney, Agent, or Firm—Rosen, Dainow & Jacobs

[57] ABSTRACT

A memory arrangement is comprised of a plurality of memory chips, and address and control lines connected to the chips. In order to minimize the effect of interference of signals from the address lines on the control lines, the address lines coupled to a portion of the chips carry address signals in inverted form, as compared with the address signals applied to the remainder of the chips, whereby interference signals of opposite polarity are induced in the control lines and cancel each other.

12 Claims, 6 Drawing Sheets

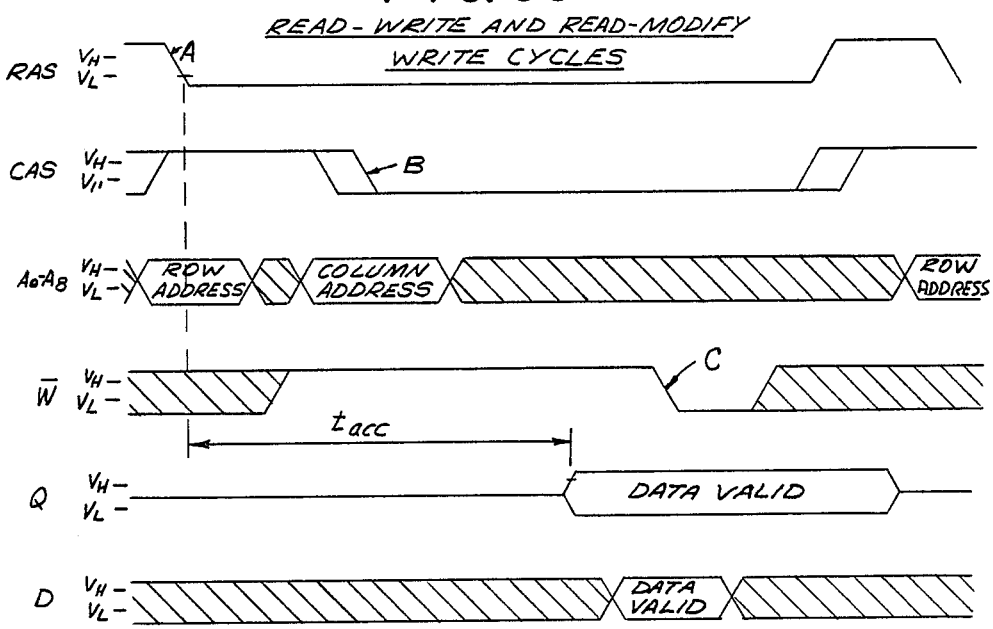
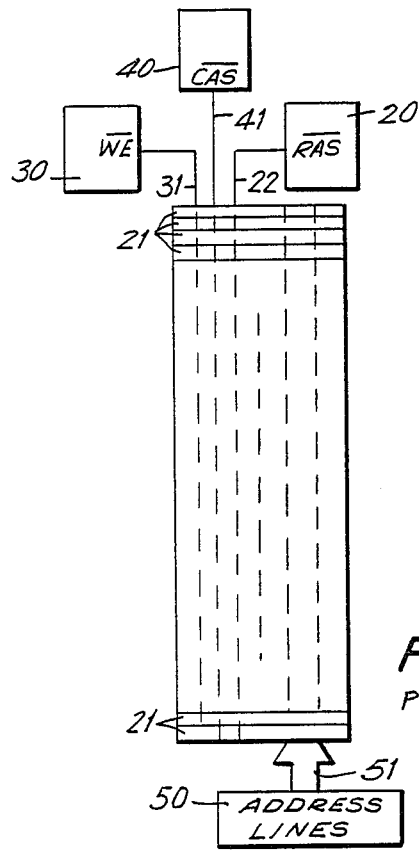

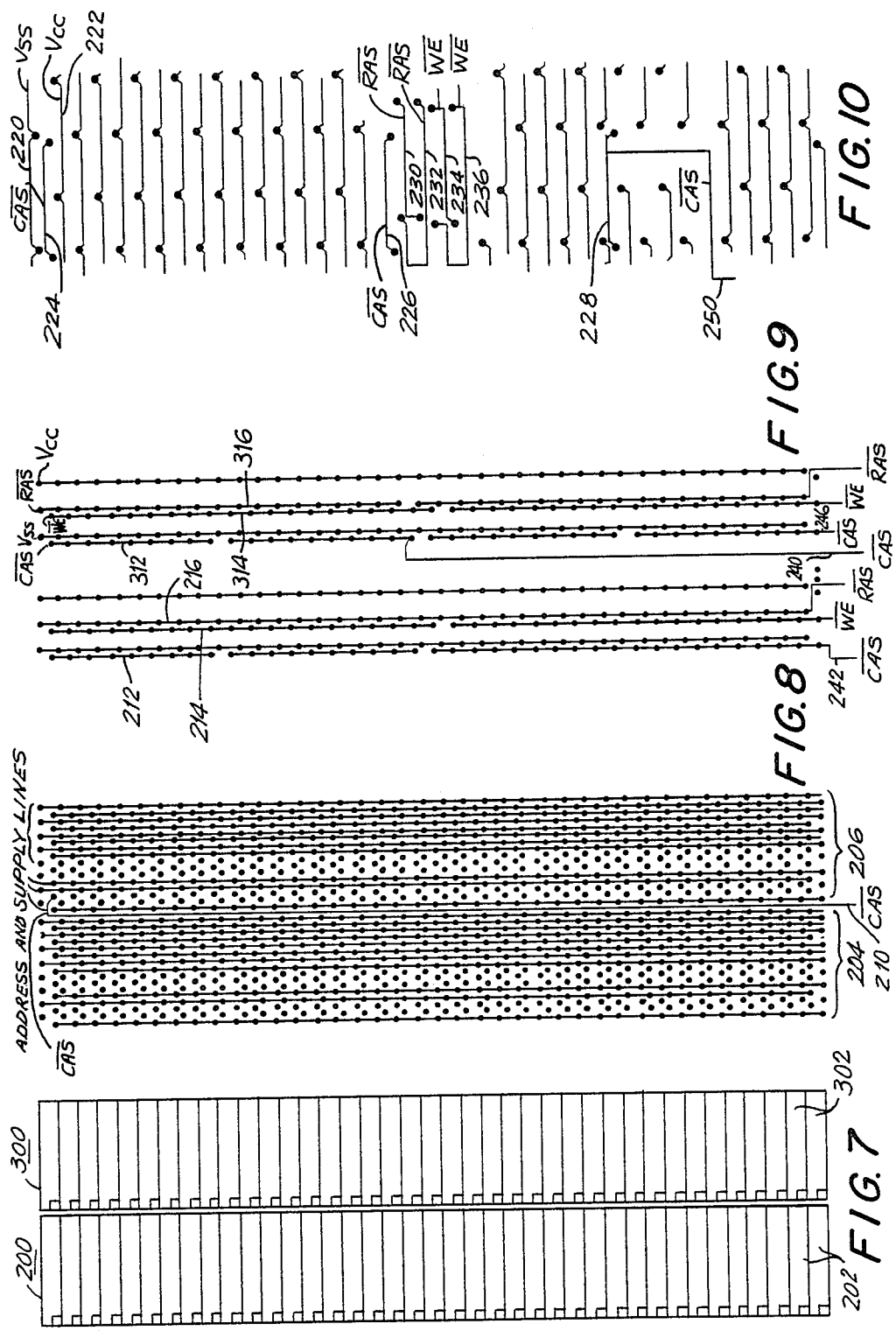

MEMORY CHIP ARRAY WITH INVERTING AND NON-INVERTING ADDRESS DRIVERS

FIELD OF THE INVENTION

This invention relates to a random access memory chip array having an arrangement for connecting the memory chips to the various driving circuits which provide the row address strobe (RAS), the column address strobe (CAS), the write enable (W) and the address signals.

BACKGROUND OF THE INVENTION

It is known to arrange a plurality of memory chips, e.g. chip M5M4256L manufactured by Mitsubishi, into a dynamic RAM array. The pin configuration of the known M5M4256L chip is shown in FIG. 1.

The M5M4256L chip is a 16 pin zigzag inline package (ZIP), including 9 address inputs $A_0$–$A_8$, a data input D, a data output Q, a write control input (write enable/w), a column address strobe input CAS, a row address strobe input (C/RAS), a 5-volt input $V_{cc}$ and a ground input $V_{ss}$. The block diagram of the M5M4256L chip is shown in FIG. 2.

To select one of the memory cells in the M5M4256L chip, an 18-bit address signal must be multiplexed into two 9 bit address signals, which are sequentially latched into the on-chip address buffer by two externally applied clock pulses. First, the negative-going edge A (see FIG. 3A) of the active low row address strobe input pulse latches the 9 row address bits; then the negative-going edge B of the active low column address strobe input pulse latches the 9 column address bits. The row and column strobe input pulses function to select the chip to be accessed. In other words, only certain chips (i.e. the selected chips) in an array of chips have both their row address bits and the column address bits latched into their on-chip address buffers.

in FIGS. 3A–3C the signal levels are denoted by voltage $V_H$ (the high level) and voltage $V_L$ (the low level). In the M5M4256L chip, $V_H$ is in the range 2.4 V to $V_{cc}$ (4.5–5.5 V) and $V_L$ is in the range 0 to 0.4 V. Also, its should be noted that the crosshatching in FIGS. 3A–3C indicates that the level of the signal does not matter, and the center line between the high and low levels for output Q indicates the high-impedance state.

In the write mode, data to be written into a selected cell is strobed by the later of the negative transition of the W input and the negative transition of the column address strobe input. In the case of the "early write" mode of the M5M4256L chip (see FIG. 3B), the write control input goes low (transition C in FIG. 3B) prior to the column address strobe input going low (transition B), so the date input D is strobed by the negative-going transition of the column address strobe input pulse. In other modes (i.e. the read-write and read-modify-write modes shown in FIG. 3C), the data input is strobed by the negative transition of the write control input (transition C in FIG. 3C).

The output of the M5M4256L chip is in the high-impedance state when the column address strobe input is high. In the read or read-write mode, the data output goes to the active conditin at the access time $t_{acc}$ and the data in the selected cell can be read. This data output will have the same polarity as the input data. Once the output has entered the active condition, this condition will be maintained until the column address strobe input goes high, irrespective of the condition of RAS.

The above-described M5M4256L chips are conventionally closely arranged in an array of rows and columns. A typical column of such an array is depicted in FIG. 4. In such an array each line of the row address strobe input driving circuit 20 is connected to all of the memory chips 21 in the column. For example, line 22 is connected to the row address strobe input terminals of the chips in the column. Each line of the column address strobe input driving circuit 40 is connected to the column address strobe input terminals of all of the memory chips in the column. For example, line 41 is connected to the column address strobe input terminals of all of the chips in the column. The column of chips conventionally comprises 8, 16, or 32 closely packed chips, for example, the chips of each group abutting one another to minimize the space required for the installation on a circuit board. Of course other numbers of chips may be completed in the group. The data terminals of the chips of each group are connected to separate lines of a data bus, whereby each group of chips corresponds to a byte or word. Any memory chip which receives both the row and column address strobe input signals is a selected chip. This chip selection enables the latching of the nine-bit address signals which are sent from the address driving circuit 50 to each of the memory chips along address bus 51. Further, the write enable control input driving circuit 30 is connected to each of the memory chips by way of line 31.

The circuit of FIG. 4 depicts a conventional manner in which memory chips are arrayed and connected to drivers. This conventional arrangement of chips is disadvantageous because of the limitation on the speed of switching of the address driving signals due to noise induced by the address driving signals in adjacent lines in the chips, e.g. the lines carrying the column address strobe, row address strobe and write control input pulses. For example, the address signals transmitted by address driver 50 induce noise signals of the same polarity in inductively coupled lines of the memory chips. For example, the noise signals induced in all portions of the column address strobe input line 41 add to produce a summed noise signal on line 41. This noise signal distorts the negative-going transition of the column address strobe input signal on line 41. Likewise, the noise signals induced in all portions of the line 22 add to produce a summed noise signal. Finally the noise signals induced in all portions of the write enable line 31 add to produce a summed noise signal on line 31.

The faster the switching speed, the greater is the magnitude of the induced noise. In the prior art arrangements the switching time (i.e. the time for the signal on an address line to make the transition from below $V_L$ to above $V_H$ or vice versa as shown in FIGS. 3A–3C) is about 20 nsec. If the switching speed is increased so that the switching time is 5 nsec, the noise amplitude increases on the on-chip lines carrying the column address strobe, row address strobe and write control input signals to a level such that false transitions of the signals on the column address strobe, row address strobe and write control input lines are possible. For example, a noise spike could be treated as a positive- or negative-going transition. Alternatively, it is possible that a noise spike will occur at the same time as a positive- or negative-going transition, thereby hindering accurate detection of the transition.

In particular, the column address strobe, for a switching time of 5 nsec, induces noise spikes in a column of chips which could overlap and partially cancel the negative-going transition of the column address strobe input signal. In addition, spikes also result from the capacitive coupling within the lead frame of the RAM chips themselves. To avoid this problem, the negative-going transition of the column address strobe input signal would have to be delayed. However, any delay in the column address signal defeats the purpose of the increased switching speed of the address signals, i.e. to speed up the storage and retrieval of information from the memory chip array by decreasing the data access time. Also, the delay between the RAS and CAS negative-going transitions must be less than a specific maximum value for the M5M4256L chips (e.g. 60 nsec for the M5M4256L-12 chip). Furthermore, with a large number of chips in each row such a delay prevents the cycle time from being effective since data can be lost due to fixed time constraints inherent in the chip. This problem limits the number of chips which can be included in a prior art dynamic RAM array.

BRIEF SUMMARY OF THE INVENTION

The object of the invention is to provide an arrangement for connecting an array of memory chips to driving circuits such that the noise induced on the column address strobe, row address strobe and write control input lines by the address signals is reduced. This is accomplished by connecting chips to inverting or non-inverting address signal drivers so that the noise signals induced in at least two chips substantially cancel each other instead of being added together.

Another object of the invention is to reduce the data access time by speeding up the switching time of the address signals, i.e. by increasing the gradient of the address signal transitions.

A further object of the invention is to allow an increase in the memory size of the dynamic RAM array by not reducing the data access time, which enables an increase in the number of memory chips in each row.

These objects are realized in accordance with the invention by connecting an inverting address signal driving circuit to at least one chip forming a common byte, word, etc. and by connecting a non-inverting address signal driving circuit to the other chip or chips of the common byte, word, etc. As a result of this arrangement, at least some cancellation of the noise induced in the lines carrying the column address strobe, row address strobe and write control input pulses is achieved. Ideally, one half of the chips in each byte, word, etc. are connected to the inverting address signal driving circuit and the other half of the chips thereof are connected to the non-inverting address signal driving circuit. As a result, the noise signals induced in the lines carrying the column address strobe, row address strobe and write control input pulses will be substantially eliminated by mutual cancellation.

Briefly stated, in accordance with the invention, a memory is comprised of a plurality of substantially identical memory chips arranged in at least one row, a source of address signals, means coupling the address signals to a plurality of said memory chips, a source of control signals, and means coupling the control signals to the plurality of memory chips. The memory has at least first and second groups of chips, each group including at least one memory chip. The means coupling the address signals comprise means coupling the address signals in relatively inverted form to the memory chips of the first and second groups of chips respectively, and the means coupling the control signals comprises means applying the control signals in the same sense to the chips of the first and second groups, whereby noise signals originating in the address signals are cancelled out in the control signals.

While the invention will be specifically directed to embodiments employing the above-discussed M5M4256L dynamic memory chip, it will of course be apparent that this discussion is exemplary only, and that the invention is equally applicable to other memory chips of the ZIP package type, as well as other package types.

BRIEF DESCRIPTION OF THE DRAWINGS

The invention will be now described in detail with reference to the drawings, wherein:

FIGS. 3A–3C are respective timing diagrams for the read, write and read-write cycles of the M5M4256L chip;

FIG. 4 is a block diagram of an array of memory chips connected to driving circuits in a conventional manner;

FIG. 7 is a simplified top view of a portion of a memory in accordance with one embodiment of the invention, employing two columns of 39 memory chips each;

FIG. 8 is a circuit diagram of one printed circuit layer for use with the memory of FIG. 7;

FIG. 9 is a circuit diagram of another printed circuit board layer for use with the memory of FIG. 7;

FIG. 10 is a circuit diagram of still another printed circuit board pattern for use with the memory of FIG. 7.

DETAILED DESCRIPTION OF THE PREFERRED EMBODIMENTS

Figure 5:
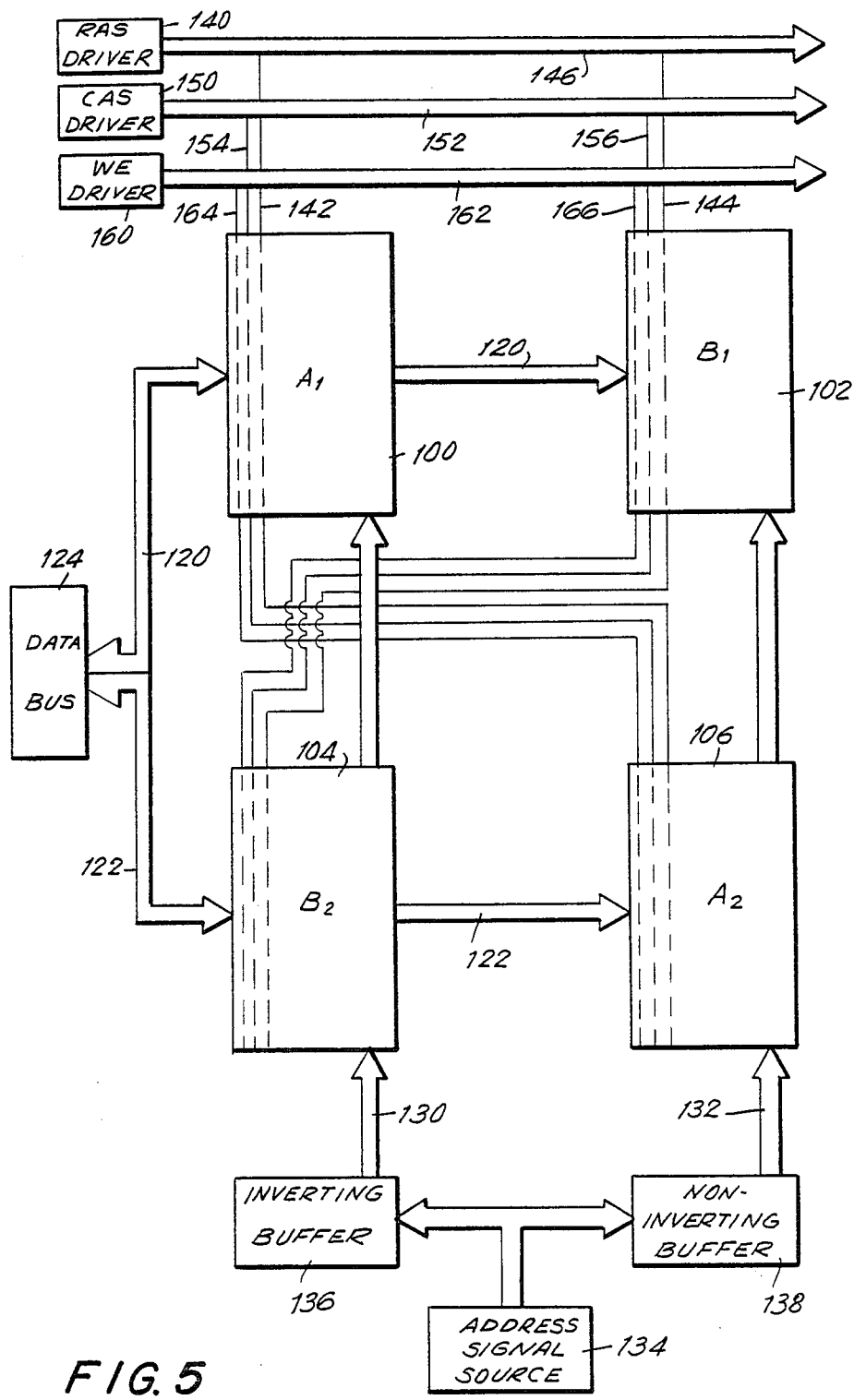
FIG. 5 is a block diagram of an array of memory chips, of the type shown in FIGS. 1 and 2, connected to driving circuits in accordance with one embodiment of the invention.

One embodiment of the invention is generally depicted in FIG. 5. The groups 100, 102, 103, 104 of memory chips are arranged in an array having two rows and two columns. Groups 100 and 102 form the first row and groups 104 and 106 form the second row. Each of the groups 100, 102, 104 and 106 includes a plurality of memory chips, for example, of the type discussed above with reference to FIGS. 1 and 2. The groups may each contain, for example, 8, 16, 32 etc. chips abutting one another so that the control lines and address lines may extend in straight lines adjacent the chips of each group. Each chip of each group stores data corresponding to a separate data line (not shown) connected in the conventional manner but the data lines corresponding to each of the groups of chips represents only a portion of a word. Thus, for example, the chips of the groups 100 and 102 may be coupled to the partial data bus 120 and the chips of groups 104 and 106 coupled to the partial data bus 122, the combined partial data buses 120 and 122 forming the complete data bus 124 of the system. In order to read or write a complete word, then, it is necessary to address a group of chips 100, 102 and a group of chips 104, 106. In the arrangement illustrated in FIG. 5, an address bus 130 is coupled to the chips of groups 100 and 104 in a common column, and another address bus 132 is coupled to the chips of groups 102, 106 in the other common column. Each of the buses 130, 132 includes all of the necessary address lines for the respective chips. The lines constituting the buses 130 and 132 are substantially straight. The address signals for the chips are derived from a conventional address signal first 134. These address signals are inverted in the inverting address buffer 136 to form the address signal on the bus 130, and are applied in non-inverted form to the bus 132, by way of the non-inverting address buffer 138. As a consequence, the signal levels (high or low) of the address signals on the buses 130 and 132 are respectively inverted.

The row address strobe driver 140 outputs row address strobe signals to the lines of a bus 146, having for example lines 142 and 144. The line 142 is directed to pass in a straight line under the chips of group 100 of the first row, and thence pass in a straight line under the chips of group 106 of the second column. Similarly, the row address strobe line 144 passes straight under the chips of group 102 of the second column, and thence is diverted to pass straight under the chips of group 104 of the first column. In a similar manner, the column address strobe is output from the driver 150 to a bus 152, having for example selection lines 154 and 156. The line 154 passes straight under the chips of the group 100, and then is diverted to pass in a straight line under the chips of group 106. Similarly, the column address line 156 passes straight under the chips of group 102 and is diverted therefrom to pass in a straight line under the chips of group 104. The enable signals are directed from the write enable driver 160, in a similar manner, to the bus 162 having selection lines 164, 166. The selection line 164 passes in a straight line under the chips in group 100 and thence is diverted to pass in a straight line under the chips of group 106. Similarly, the selection line 166 passes in a straight line under the chips of group 102 and thence is diverted to pass a straight line under the chips of group 104. The buses 146, 152 and 162 of course have additional lines if necessary for the selection of further columns and rows of the array, such additional rows and columns being addressed in a manner similar to that illustrated in FIG. 5. Groups 100 and 104 form the first column and groups 102 and 106 form the second column.

Upon the selection of a word to be accessed, for example, by a microprocessor (not shown), the row address strobe driver 140 will output an enabling signal on a line (i.e. 142 or 144) and the column address strobe driver will output an enabling signal on the selected line (i.e. 154 or 156).

The row address strobe input signal enables the on-chip address buffers of the chips receiving the row address strobe input signal, whereby the row address bits supplied by the address driver lines are input to the respective address buffers. For example, if the row address strobe input signal is transmitted along line 142, inverted row address signals from the inverting address buffer 136 will be latched into the address buffers of memory chips of group 100 and non-inverted row address signals from the non-inverting address buffer 138 will be latched into the address buffer of memory chips of group 106. If thereafter the column address strobe input signal is transmitted along line 154, inverted column address signals from the inverting address buffer 136 will be latched into the address buffer of the memory chips of group 100 and the non-inverted address signals from the non-inverting address buffer 138 will be latched into the address buffer of the chips of group 106.

Figure 3A:
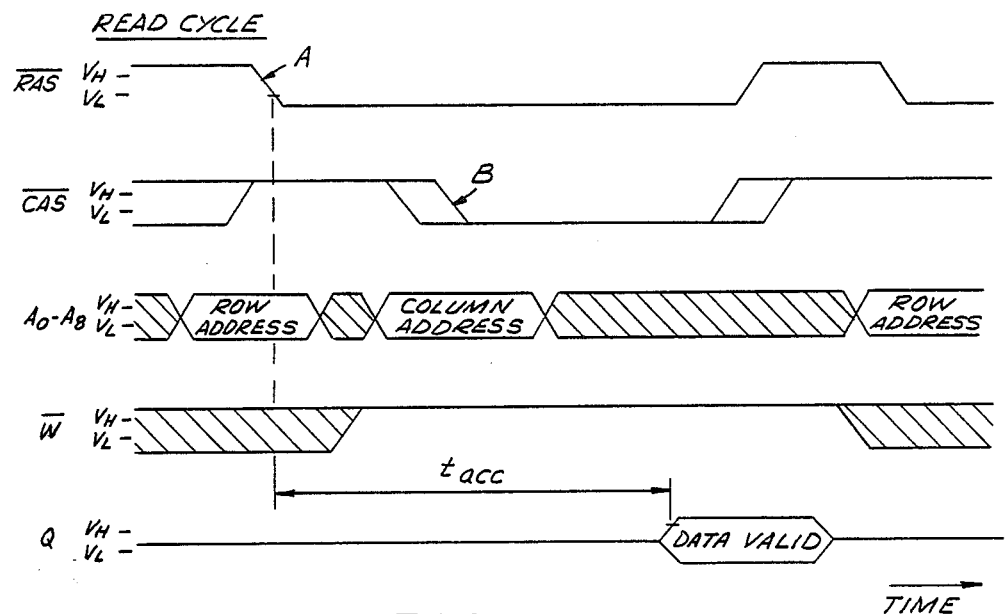
Figure 3B:
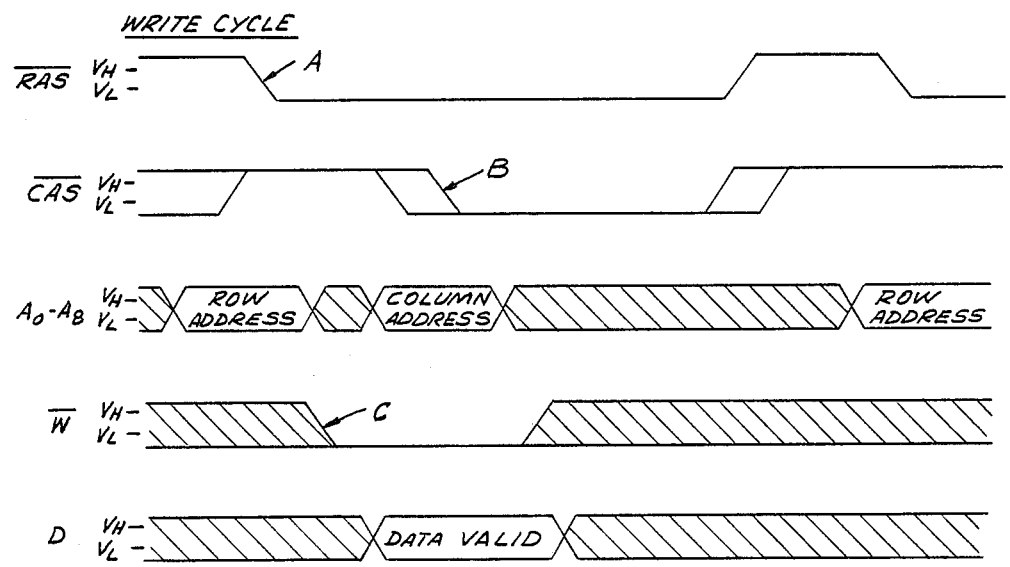

As can be seen in FIGS. 3A-3C, the switching of the outputs of the address drivers to the levels of the row address signals precedes the negative-going transition of the RAS pulse. Likewise the switching of the outputs of the address drivers to the levels of the column address signals precedes the negative-going transition of the column address strobe input pulse. This address switching on the lines address (see FIG. 1) induces noise signals (e.g. spikes) on the lines column address strobe, row address strobe and write control input, as previously discussed.

However, in accordance with the invention, the memory chips have been connected to the driving circuits in a manner such that the noise signals substantially cancel each other. For example, the inverting address buffer 136 when switched to output the row address, will induce a noise spike of one polarity on lines 142 and 144. On the other hand, the non-inverting address buffer 138—which outputs address signals that are the inverse of the address signals output by the inverting address buffer 136—when switched to output the row address, undergoes address switching transitions which are opposite in direction, i.e. will induce a noise spike of opposite polarity on lines 142 and 144. Because the negative- and positive-going transitions of the address switching occur between the same high and low levels, the amplitudes of the noise spikes of opposite polarity on lines 142 and 144 have substantially equal amplitudes. Accordingly, the noise spikes of opposite polarity and substantially equal amplitude will substantially cancel on lines 142 and 144. As a result of this cancellation of noise, the disadvantages of the prior art, i.e. false transitions on the column address strobe, row address strobe and write control input lines and the distortion of and interference with the transitions of the column address strobe, row address strobe and write control input pulses, are avoided.

Similarly, the noise signals on column address lines 154 and 156 substantially cancel one another because the polarity of the noise signals induced on lines 154 and 156 by switching of the inverted address signals will be opposite in polarity to the noise signals induced on lines 154 and 156 by switching of the non-inverted address signals.

Likewise the noise signals respectively induced by the switching of inverted and non-inverted address signals substantially cancel on lines 164 and 166 connected to the write enable driver 160.

In the embodiment of the invention illustrated in FIG. 5, cancellation of noise induced by signals on the address lines is effected by extending inverted and non-inverted address signals in straight lines on the board under different groups of chips corresponding to different portions of a word, while zigzagging the row address, column address and write enable signal lines on the board under the different groups of chips, in order to each be subject to substantially the same interference from both the inverting and non-inverting address signals.

Figure 6:
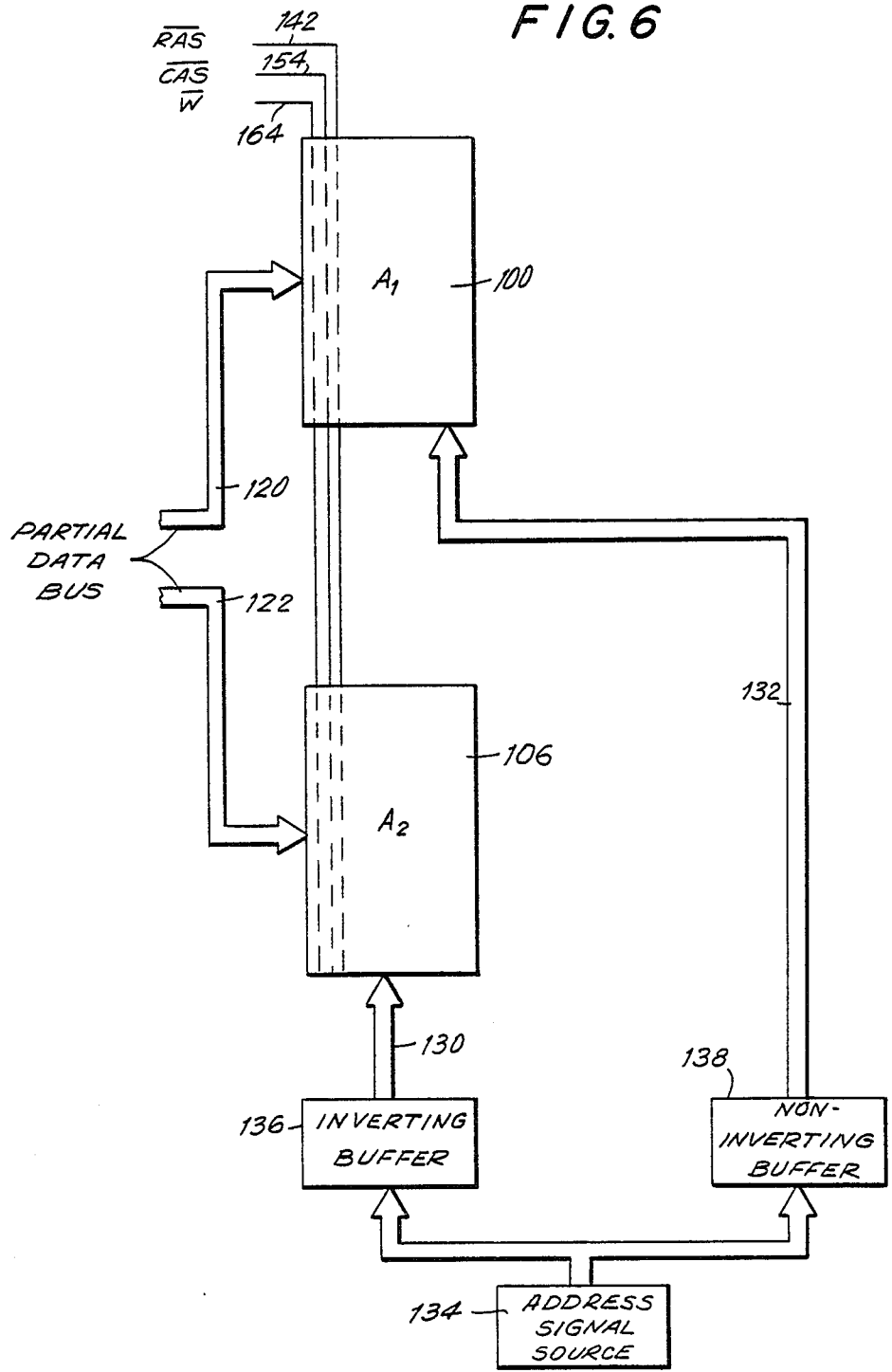
FIG. 6 is a block diagram of an array of memory chips, of the type shown in FIGS. 1 and 2 connected to driving circuits in accordance with another embodiment of the invention.

In a modification of the invention as illustrated in FIG. 6, the groups 100 and 106 of memory chips corresponding to the same word are provided in a common column, with the row address, column address and write enable lines extending in a straight line under the chips of both of these groups. In this embodiment of the invention, the lines 130 and 132 extending from the inverting and non-inverting buffers 136, 138 are directed to extend in straight lines under their respective groups 106, 100 of memory chips, in this case at least one of the address buses 130, 132 being in non-straight lines on the printer circuit board to enable its passage under the respective groups of memory chips.

The selection of techniques of extending the various lines under the groups of chips is a matter of choice, depending for example whether it is easier to divert the control lines or the address lines. At any rate, however, in accordance with the invention it is preferred that each of the control lines extends along a path to be subject to substantially the same influence from the inverted and non-inverted address lines, whether or whether not such extension occurs in fact under the various memory chips. It will be further apparent that the numbers of chips provided in each of the groups may be varied, as desired, in order to obtain the desired noise cancellation, and that the numbers of separate groups of chips into which the words are separated may also be varied, with the various lines being diverted in accordance with the concept illustrated with respect to FIGS. 5 and 6 herein. Thus, for example only, each group may contain as few chips as one and the buses 130, 132 from the inverting and non-inverting buffers may extend from one end of the various columns as illustrated in FIG. 5, or alternatively, across the board its immediate groups of memory chips forming words.

Figure 1:
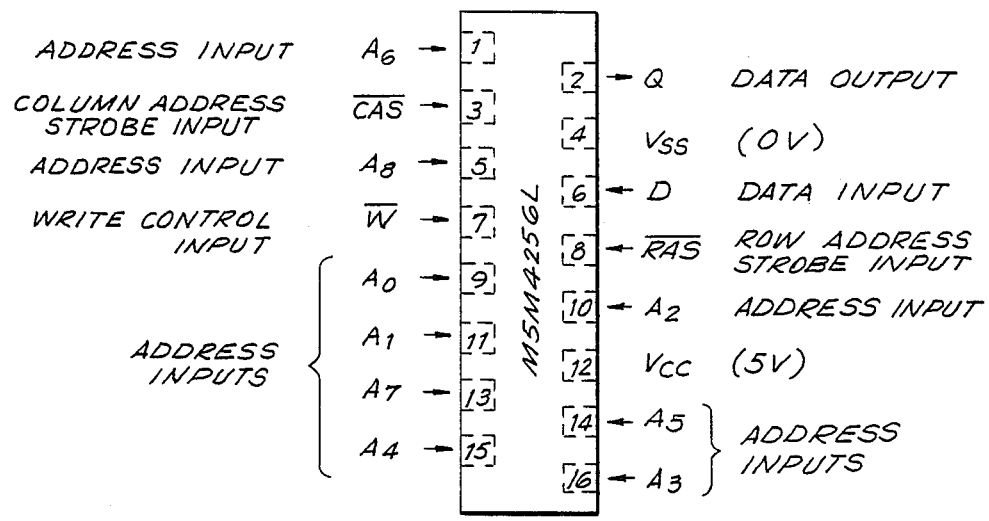
FIG. 1 is a schematic representation of the pin arrangement of the M5M4256L chip.
Figure 2:
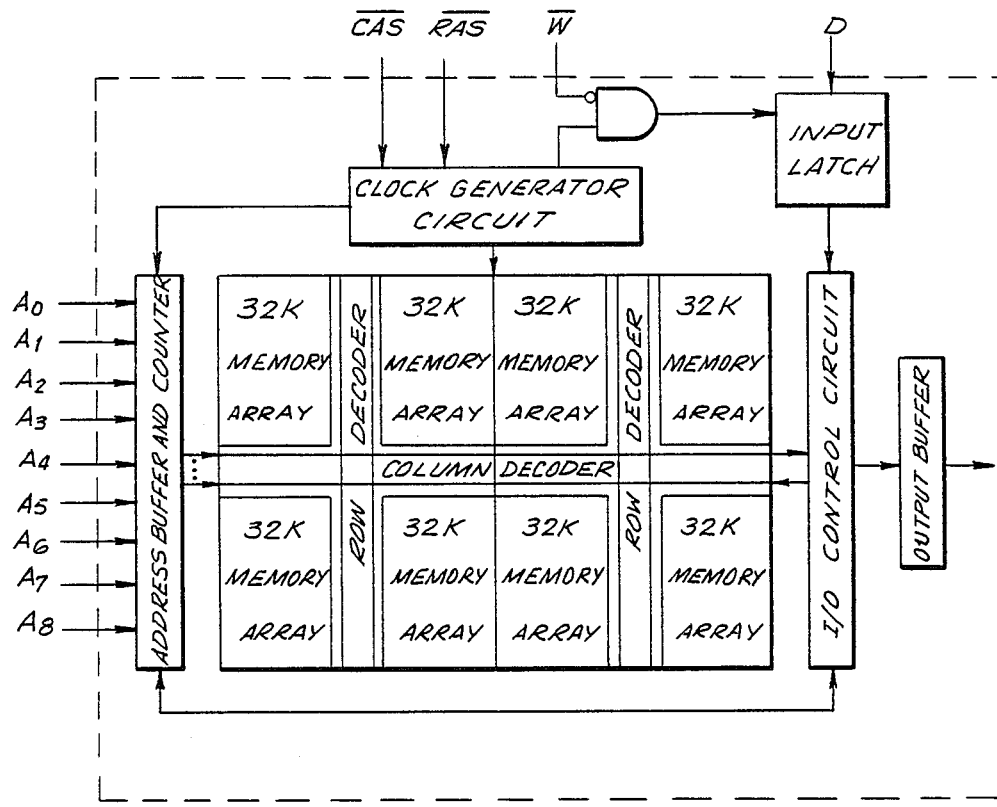
FIG. 2 is a block diagram of the internal circuitry of the chip shown in FIG. 1.

In one arrangement in accordance with the invention, as illustrated in FIG. 7-10, a memory is comprised of two columns 200, 300 of chips of the type described with reference to FIG. 1, i.e. having ZIP packages. In this example, each of the columns 200, 300 is comprised of 39 closely packed chips 202, 302. FIGS. 8, 9 and 10 illustrate the different layers of circuit board patterns on the board for mounting the chips 202, 302, the board being of conventional nature preferably being a multilayered board in order to permit the highest density of circuit elements. FIG. 8 illustrates one circuit board layer for address and voltage supply lines. Thus, the lines 204 are straight lines passing under the chips of column 200, including address and voltage supply lines, of which the address lines may be inverted. The group of lines 206 are the address and voltage lines for the chips of column 300, the address lines in this group carrying non-inverted address signals. The circuit board pattern of FIG. 8 may include one column address strobe input line 210 directed to an upper group of chips in order to simplify the wiring pattern.

FIG. 9 illustrates another layer of the printed circuit board, this layer carrying straight control lines, as well as duplicates of the voltage lines. It is noted that each of the column address lines 212, 312 is separated into four sections, while each write enable line 214, 314 and each row address line 216, 316 is separated into two groups. Various ones of these lines are brought out to external terminations, as indicated by their labels at the bottom of this figure.

FIG. 10 illustrates a further layer of the printed circuit board, showing the transverse lines including interconnections between the various voltage supply lines as well as necessary crossovers between the row and column address lines and write enable lines. Thus, the lines 220, 222 interconnect the various voltage supply lines. Lines 224, 226 and 228 interconnect the groups of column address lines of the columns 200, 300, while the lines 230, 232, 234 and 236 cross over the row address and write enable lines at the center of the memory, in the matter illustrated in FIG. 5. The column address lines are brought out separately for the different groups, such as on the line 210 of FIG. 8, the lines 240, 242 and 246 of FIG. 9 and the line 250 of FIG. 10. Thus, the column strobe input lines may cross over several times as they extend under the memory chips. It is of course apparent that the arrangement of FIG. 7-10 may constitute only part of a complete memory, and that, for example, additional rows of chips may also be provided. The interconnections of the data bus to the chips is effected in conventional manner, for example by transverse lines extending in the direction of the lines of FIG. 10, and on a still further layer of the printed circuit board.

FIG. 7-10 illustrate in a clearer manner the close proximity of the control and signal lines that gives rise to noise signals, as well as a simple matter in accordance with one embodiment of the invention for overcoming this problem.

The foregoing description of the preferred embodiment is presented for illustrative purposes only and is not intended to limit the scope of the invention as defined in the appended claims. Modifications may be readily effected by one having ordinary skill in the art without departing from the spirit and scope of the inventive concept herein disclosed. In particular, it should be noted that the invention may be applied to an array of dynamic RAM chips of any type, not only the M5M4256L chips discussed as examples herein.

What is claimed is:

1. In a memory comprised of a plurality of substantially identical memory chips arranged in at least one row, a source of address signals, means coupling said address signals to a plurality of said memory chips, a source of control signals, and means coupling said control signals to said plurality of memory chips;

the improvement wherein said memory has at least first and second groups of chips, each group including at least one memory chip, said means coupling said address signals comprising means coupling said address signals in relatively inverted form to the memory chips of said first and second groups of chips respectively, and said means coupling said control signals comprises means applying said control signals in the same sense to the chips of said and second groups, whereby noise signals originating in said address signals are cancelled out in said control signals.

2. In a memory system comprised of a plurality of semiconductor memory chips, said memory chips each having at least one control terminal and a plurality of address terminals, a source of address signals, a source of control signals, and a mounting arrangement for said chips and including a plurality of address lines connected between said source of address signals and separate terminals of each of said chips, and a control line connected between said source of control signals and the control terminal of each said chip; the improvement wherein said source of address signals comprises means providing first and second relatively inverted address signals, said plurality of memory chips comprising first and second groups of memory chips, said address lines including a first plurality of address lines connected to apply said first address signals to the memory chips of said first group of memory chips and a second plurality of address lines connected to apply said second address signals to the memory chips of said second group of memory chips, whereby interference signals on said first and second pluralities of address lines induce interference signals of opposite sense in said control line.

3. The memory system of claim 2 wherein said first and second groups of memory chips are arranged in a common column, said control line extends in a straight line on said mounting arrangement adjacent and between said memory chips of said first and second groups, and corresponding address lines of said first and second pluralities of address lines are in line with one another and extend in straight lines adjacent said the memory chips of said first and groups of memory chips respectively.

4. The memory system of claim 3 wherein said memory chips are dynamic memory chips, and said control line is a row address strobe line.

5. The memory system of claim 3 wherein said memory chips are dynamic memory chips, and said control line is a column address strobe line.

6. The memory system of claim 3 wherein said memory chips are dynamic memory chips, and said control line is a write enable signal line.

7. The memory system of claim 3 wherein said memory chips comprise ZIP packages.

8. The memory system of claim 2 wherein said first and second groups of memory chips are arranged in separate parallel spaced apart columns, said control line extends in a straight line on said mounting arrangement adjacent the memory chips of said first and second second groups of memory chips, whereby the portion of said control line passing adjacent said first group of chips is not in alignment with the portion thereof passing adjacent said second group of memory chips, and corresponding address lines of said first and second pluralities of address lines are displaced from one another as they pass adjacent the memory chips of said first and second groups respectively.

9. The memory system of claim 8 wherein said memory chips are dynamic memory chips, and said control line is a row address strobe line.

10. The memory system of claim 8 wherein said memory chips are dynamic memory chips, and said control line is a column address strobe line.

11. The memory system of claim 8 wherein said memory chips are dynamic memory chips, and said control line is a write enable signal line.

12. The memory system of claim 8 wherein said memory chips comprise ZIP packages.

* * * * *